United States Patent
Veca et al.

(10) Patent No.: US 10,493,814 B2
(45) Date of Patent: Dec. 3, 2019

(54) ELASTIC SUPPORT WITH AN INTEGRATED LOAD SENSOR FOR SUSPENSION SYSTEMS OF A MOTOR-VEHICLE

(71) Applicant: C.R.F. Società Consortile per Azioni, Orbassano (Turin) (IT)

(72) Inventors: Antonino Domenico Veca, Casalborgone (IT); Paolo Chiappero, Cavour (IT); Francesca Dalmasso, Turin (IT); Vito Guido Lambertini, Giaveno (IT)

(73) Assignee: C.R.F. SOCIETA CONSORTILE PER AZIONI, Orbassano (Turin) (IT)

( * ) Notice: Subject to any disclaimer, the term of this patent is extended or adjusted under 35 U.S.C. 154(b) by 74 days.

(21) Appl. No.: 15/830,971

(22) Filed: Dec. 4, 2017

(65) Prior Publication Data

US 2018/0304716 A1    Oct. 25, 2018

(30) Foreign Application Priority Data

Apr. 21, 2017    (EP) .................................... 17167486

(51) Int. Cl.
  B60G 17/019    (2006.01)
  G01L 1/18    (2006.01)
  (Continued)

(52) U.S. Cl.
  CPC ..... *B60G 17/01941* (2013.01); *B60G 17/016* (2013.01); *B60G 17/019* (2013.01); *G01L 1/18* (2013.01); *H05K 1/0373* (2013.01); *H05K 3/105* (2013.01); *B60G 2204/11* (2013.01); *B60G 2204/112* (2013.01); *B60G 2204/116* (2013.01); *B60G 2204/41* (2013.01);
  (Continued)

(58) Field of Classification Search
  None
  See application file for complete search history.

(56) References Cited

U.S. PATENT DOCUMENTS

| 3,913,696 | A | * | 10/1975 | Kennedy | .................. | B60G 7/02 |
| | | | | | | 180/292 |
| 4,798,396 | A | * | 1/1989 | Minakawa | ............... | B60G 3/26 |
| | | | | | | 280/124.138 |

(Continued)

FOREIGN PATENT DOCUMENTS

| CA | 1289221 | 9/1991 |
| JP | 60-106807 | 7/1985 |
| WO | 2012/055934 A1 | 5/2012 |

OTHER PUBLICATIONS

European Search Report dated Sep. 14, 2017 for corresponding EP Application No. 17167486.4.

*Primary Examiner* — Drew J Brown
(74) *Attorney, Agent, or Firm* — Heslin Rothenberg Farley & Mesiti P.C.; Victor A. Cardona, Esq.

(57) ABSTRACT

An elastic support for on-board suspension systems of a motor-vehicle includes at least one body formed of polymeric elastomeric material supplemented with carbon-based nanofillers. An outer surface is provided with one or more piezo-resistive areas where a polymeric material supplemented with carbon-based nanofillers has been made locally piezo-resistive by laser irradiation so as to define one or more electric deformation sensors configured to detect the load applied on the elastic support.

19 Claims, 3 Drawing Sheets

(51) Int. Cl.
*B60G 17/016* (2006.01)
*H05K 1/03* (2006.01)
*H05K 3/10* (2006.01)
*H05K 3/00* (2006.01)

(52) U.S. Cl.
CPC ...... *B60G 2206/73* (2013.01); *B60G 2400/60* (2013.01); *B60G 2401/10* (2013.01); *B60G 2401/26* (2013.01); *B60G 2600/02* (2013.01); *B60G 2600/182* (2013.01); *H05K 3/0008* (2013.01); *H05K 2201/0133* (2013.01); *H05K 2201/026* (2013.01); *H05K 2201/0323* (2013.01); *H05K 2203/107* (2013.01); *H05K 2203/1136* (2013.01)

(56) References Cited

U.S. PATENT DOCUMENTS

| | | | |
|---|---|---|---|
| 4,800,751 A | | 1/1989 | Kobayashi et al. |
| 4,880,318 A | * | 11/1989 | Shibahara .......... B60G 21/0551 |
| | | | 384/125 |
| 5,738,343 A | * | 4/1998 | Nakajima ................ F16F 13/26 |
| | | | 267/140.14 |
| 2018/0304721 A1 | * | 10/2018 | Veca .................. B60H 1/00585 |

* cited by examiner

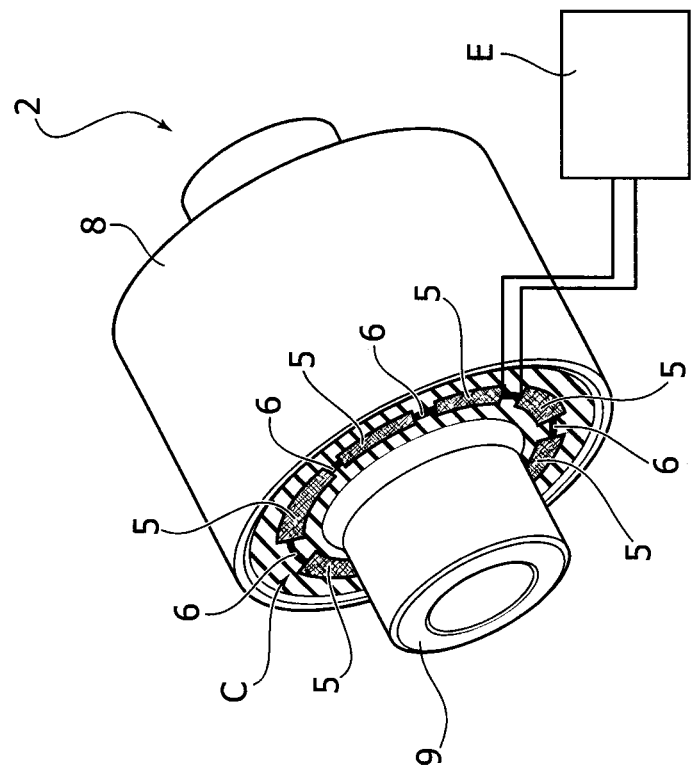
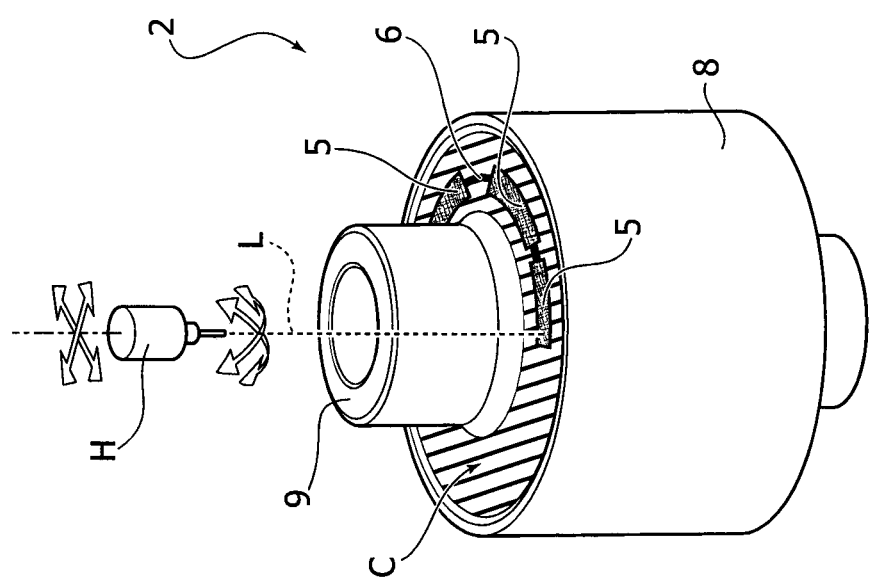

ELASTIC SUPPORT WITH AN INTEGRATED LOAD SENSOR FOR SUSPENSION SYSTEMS OF A MOTOR-VEHICLE

CROSS REFERENCE TO RELATED APPLICATIONS

This application claims priority to European Patent Application No. 17167486.4 filed on Apr. 21, 2017, the entire disclosure of which is incorporated herein by reference.

This application is also related to U.S. Ser. No. 15/830,960, filed concurrently herewith, entitled "SEALING FOR MOTOR-VEHICLES WITH INTEGRATED ANTI-PINCHING SYSTEM".

This application is also related to U.S. Ser. No. 15/830,983, filed concurrently herewith, entitled "TUBE MADE OF ELASTOMETRIC MATERIAL FOR A SYSTEM WHICH IS ON-BOARD OF A MOTOR-VEHICLE".

FIELD OF THE INVENTION

The present invention relates to elastic supports for suspension systems which are on-board of a motor-vehicle.

PRIOR ART

The detection of the load levels to which suspension systems on-board of a motor-vehicle are subjected to, in order to operate driving auxiliary systems adapted to improve the comfort and/or the grip of the motor-vehicle itself, is an issue particularly felt by companies in this sector. The solutions currently-available on the market include the use of discrete displacement sensors coupled to a damping system, such as the solution described in the document JP S60 106807 U.

However, these solutions are not very compact and also require very complex assembly steps with relative high installation costs.

The same Applicant has proposed, in the document WO 2012/055934 A1, a method for producing conductive and/or piezo-resistive traces in a non-conductive polymeric substrate, by means of laser irradiation, wherein said substrate is a composite polymeric material, comprising a matrix with a polymer unsusceptible to carbonization following thermal degradation, and a dispersed step comprising carbon nanotubes or carbon nitride or carbon nanofibers.

The present invention builds on the requirement to find an advantageous application of this method, in order to produce an elastic support with an integrated load sensor for an on-board suspension system of a motor-vehicle, such as pads and bushings for vehicle suspension or elastic plugs for engine suspension.

OBJECT OF THE INVENTION

An object of the present invention is, therefore, to produce an elastic support for suspension systems on-board of motor-vehicles, which exploits the possibilities offered by the method proposed by the Applicant in the document WO 2012/055934 A1, in an advantageous manner.

Another object of the invention is to achieve the aforesaid objective through an elastomeric component with an integrated load sensor, without having to use an additional sensor or having to resort to systems that operate on logic circuitry, which are unreliable in certain cases.

Another object of the invention is to produce a component that is simple and economical to construct, and at the same time is extremely reliable in carrying out the functions for which it is provided.

SUMMARY OF THE INVENTION

In view of achieving the aforesaid objects, the present invention aims to provide an elastic support for suspension systems which are on-board of a motor-vehicle, characterized in that it comprises at least one body formed of polymeric elastomeric material supplemented with carbon-based nanofillers, the outer surface of said body having one or more piezo-resistive areas where a polymeric material supplemented with carbon-based nanofillers of said body has been made locally piezo-resistive by laser irradiation, so as to define one or more electric deformation sensors capable of detecting the load applied on said elastic support.

Thanks to these characteristics, the elastic support according to the present invention integrates the load detection function within the component itself, without having to use an additional sensor or having to resort to logic circuitry susceptible to false signaling.

According to another characteristic of the invention, the body formed of polymeric elastomeric material supplemented with carbon-based nanofillers also comprises one or more conductive paths where the added polymeric material with carbon-based nanofillers has been made locally electrically conductive by means of laser irradiation, so as to define one or more lines of electrical connection of said piezo-resistive areas with electrodes associated with the body.

In a first embodiment of the invention, the elastic support is an elastic bushing for articulating a pivoting arm of a motor-vehicle suspension.

In a second embodiment, the elastic support is a pad of a shock absorber unit of a motor-vehicle suspension.

The present invention is also directed at a motor-vehicle, comprising a plurality of elastic supports of the type indicated above, and an electronic control unit configured to monitor the electrical resistance of one or more electrically-conductive paths including said piezo-resistive areas and configured to operate an on-board system of a motor-vehicle able to improve the comfort of the driver of the motor-vehicle and/or to improve the grip of the motor-vehicle in the case in which the measured electrical resistance deviates from a predetermined threshold value.

Further characteristics and advantages of the invention will become apparent from the following description and the attached claims.

DETAILED DESCRIPTION OF THE EMBODIMENTS OF THE INVENTION

The attached drawings are provided purely by way of non-limiting example, wherein:

FIG. 4 is a schematic view that illustrates a step of the production method of a support according to a second embodiment of the invention; and FIG. 5 illustrates another perspective view of the elastic support of the preceding Figure;

Figure 1:
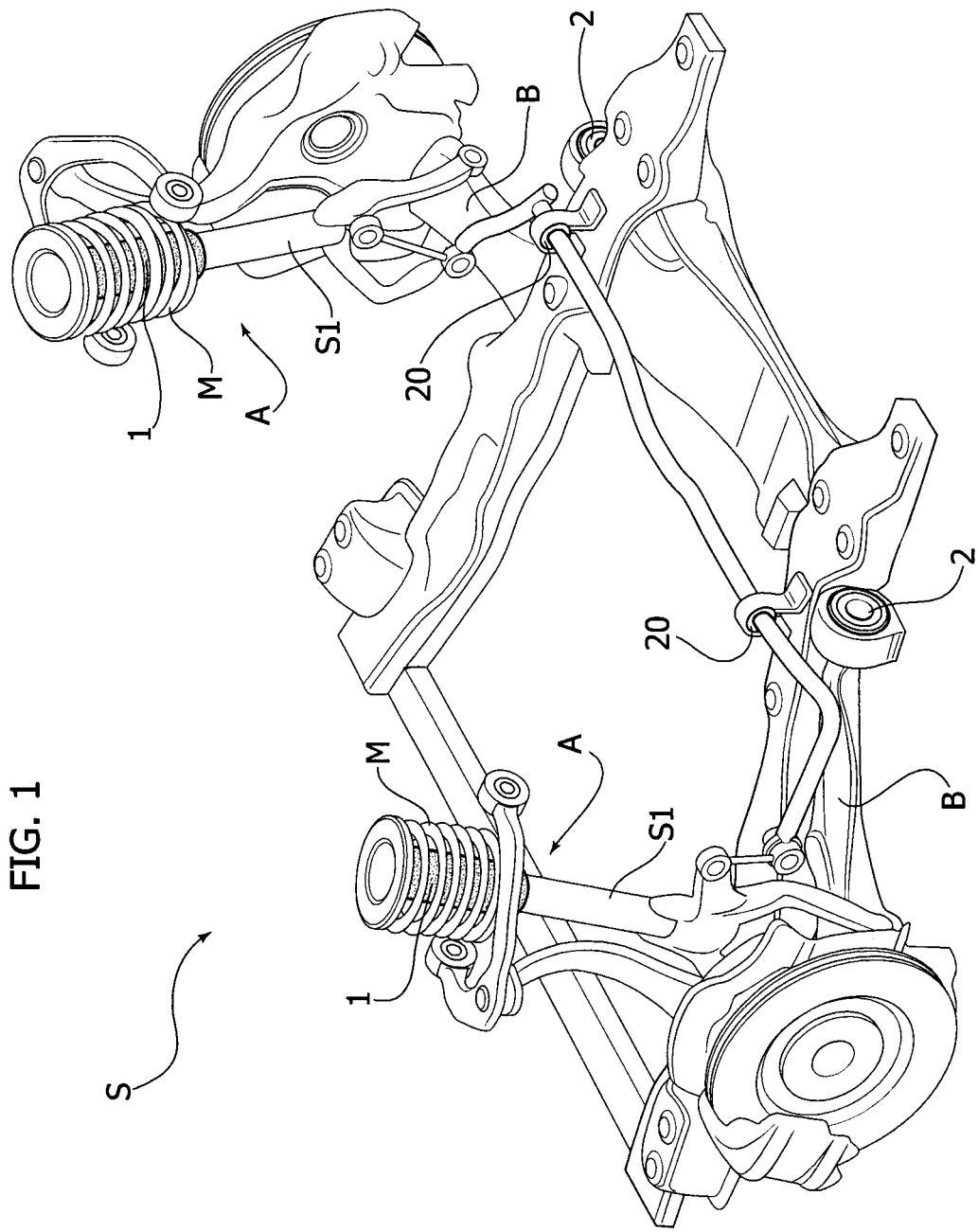
FIG. 1 is a perspective view of a motor-vehicle suspension provided with a plurality of elastic supports according to the present invention.

In the attached drawings, references 1 and 2 indicate two alternative embodiments of an elastic support according to the present invention, for an on-board suspension system of a motor-vehicle. Specifically, the embodiments illustrated in the drawings are a pad 1 of a shock absorber unit A and an elastic bushing 2 for articulating a pivoting arm B, both of which are arranged on a motor-vehicle suspension S. The architecture of the suspension S illustrated in the perspective view of FIG. 1 is to be considered purely by way of example, since other suspension types can be associated with the elastic supports according to the present invention. In addition, these specific embodiments of elastic supports (pads and bushings) are not to be considered in any way limitative, since the present invention is also directed, for example, at elastic plugs for an engine suspension system of a motor-vehicle.

Figure 3:
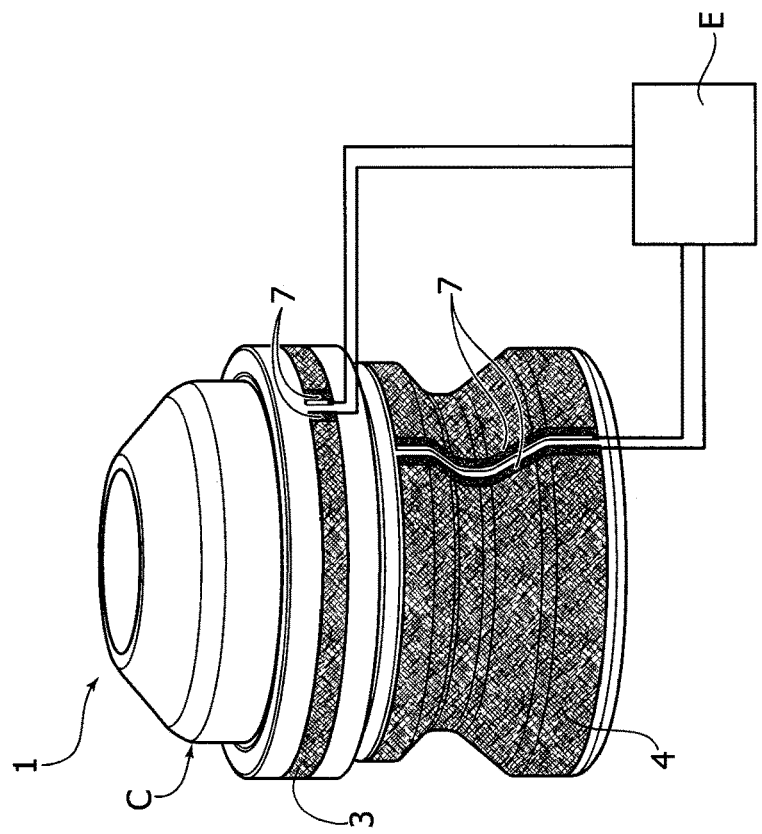
FIG. 3 illustrates a perspective view of the elastic support of the preceding Figure.

According to an essential characteristic of the present invention, the elastic support 1, 2 comprises at least one body C formed of polymeric elastomeric material having functionalized portions consisting of a polymeric material supplemented with carbon-based nanofillers according to the disclosures of the document WO2012/055934 A1 by the same Applicant (FIGS. 3,4).

In the known method of this document, a polymeric-based material is supplemented with carbon-based nanofillers, such as carbon nanotubes or carbon nitride or carbon nanofibers, in an amount insufficient to make the material electrically conductive. In the embodiments of the invention illustrated in the drawings, and in particular with reference to FIGS. 2-3 and 4-5 that illustrate, respectively, an elastic support in the form of a shock absorber 1 and an elastic bushing 2, a surface of a body C of these elements 1, 2 is subjected to the method known by WO2012/055934 A1. This method envisages the directing of a laser beam L emitted by a laser head H over the polymeric material of the elastic support in order to form a plurality of piezo-resistive areas 3, 4, 5.

FIG. 4 shows schematically a laser head H movable according to two orthogonal directions X, Y and also equipped with means for pivoting the laser beam L in one plane or two orthogonal planes. The solution schematically illustrated in FIG. 4 is provided purely as an indication, being possible to envisage that, alternatively, the support 2 moves relative to the laser head H or to envisage a combination of movements of the support 2 and the laser head H.

According to another characteristic of the invention, the laser irradiation on the surface of the body C of the elastic supports 1, 2 is carried out in such a way as to form, in addition to the piezo-resistive areas 3, 4, 5, one or more electrically-conductive paths 6 where the laser beam L causes a carbonization of the material. The details relative to the base material, the type of nanofillers, the type of usable laser, and the means for moving the laser head H are not illustrated here, for simplicity and clarity, since such details, taken in their own right, do not fall into the scope of the present invention and are achievable in any known manner, according to the disclosures contained in the document WO 2012/055934 A1.

Figure 2:
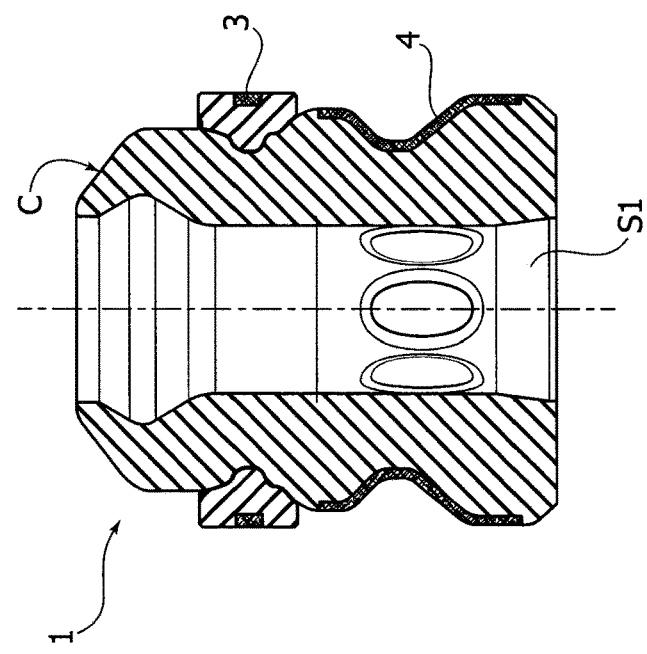
FIG. 2 illustrates a cross-section view of a first embodiment of an elastic support according to the present invention.

More specifically and with reference to FIGS. 2 and 3, a cross-sectional view and a perspective view are illustrated, respectively, of an elastic support according to the present invention, in the form of a shock absorber 1. According to a known architecture, the pad 1 is arranged at the upper end of the stem S1 of the shock absorber unit A so as to be coaxial with the spring M. On the outer surface of the pad 1, a plurality of piezo-resistive areas are formed, produced in the shape of a first sensorized band 3 and a second sensorized band 4. The two bands 3, 4 extend along the entire circumferential extension of the pad 1 and more particularly, the first sensorized band 3 is substantially smaller than the second sensorized band 4 also provided on the outer surface of the pad 1. The two bands 3, 4 are formed on the outer surface of two different polymeric materials which constitutes the pad 1.

The arrangement of the sensorized bands 3, 4 on the outer surface of the pad 1 may vary widely with respect to that illustrated, without thereby undermining the operation of the sensorized pad 1 according to the invention. Electrodes 7 are found at adjacent ends of each sensorized band 3, 4, which act as conductive metal terminals so that its ends are connected to an electronic control unit E arranged on-board the motor-vehicle. The functions of the electronic control unit E will be described further in the following description.

With reference to the embodiment illustrated in FIGS. 4 and 5, the elastic support according to the present invention is in the form of an elastic bushing 2, for example, for a pivoting arm B of the suspension S. The elastic bushing according to an architecture known in itself has a metal outer shell 8 with an inner body C of elastomeric material in which a metal pin 9 passes through. However, other types of elastic bushings for suspension can be produced according to the disclosures of the present invention, such as bushings 20 for brackets of a stabilizing bar associated with the motor-vehicle suspension S (FIG. 1).

The bushing 2 comprises a body C of polymeric elastomeric material subjected to the method according to the disclosures of the document WO2012/055934 A1, so that a plurality of piezo-resistive areas 5 are obtained, connected by conductive paths 6. In the specific form illustrated in the drawings, the conductive paths 6 are arranged in such a way that the piezo-resistive areas 5 are connected in series with each other, but areas connected in parallel can also be provided. At the ends of two adjacent piezo-resistive areas 5, there are two conductive electrical paths whose ends are connected to an electronic control unit E of the motor-vehicle (in a manner completely similar to that previously described for the pad 1).

With reference to both the embodiment constituting the pad 1 (FIGS. 2 and 3) and to the embodiment constituting the bushing 2 (FIGS. 4 and 5), the on-board electronic control unit E of the motor-vehicle is configured to monitor the electrical resistance of one or more of the electrically-conductive paths including the piezo-resistive areas, so as to operate an auxiliary system to facilitate the driving of the motor-vehicle, in the case in which the measured electrical resistance exceeds a predetermined threshold value. This auxiliary system can be designed, for example, to improve the comfort of the motor-vehicle and/or to improve the grip of the motor-vehicle.

As stated above, the present invention can also be produced in the form of an elastic support for an engine suspension of the motor-vehicle, in which the load detection functions to which the support is subject to are integrated into the support itself.

Thanks to the characteristics described above, the support according to the present invention advantageously exploits the possibilities offered by the method proposed by the Applicant in the document WO2012/055934 A1, by means of producing an object that is simple and economical to construct, but at the same time being extremely reliable in the case of detecting the load that triggers the activation of an on-board system of the motor-vehicle, which can improve the comfort of a driver of the motor-vehicle and/or improve the grip of the motor-vehicle itself.

Of course, without prejudice to the principle of the invention, the details of construction and the embodiments may vary widely with respect to those described and illustrated purely by way of example, without departing from the scope of the present invention as defined in the appended claims.

What is claimed is:

1. Elastic support for suspension systems which are on-board of a motor-vehicle, comprising:
    at least one body formed of polymeric elastomeric material supplemented with carbon-based nanofillers,
    the outer surface of said body having one or more piezo-resistive areas where a polymeric material supplemented with carbon-based nanofillers of said body has been made locally piezo-resistive by laser irradiation, so as to define one or more electric deformation sensors capable of detecting the load applied on said elastic support;
    wherein said piezo-resistive areas are in the form of a first and a second sensorized band, which both extend along the circumferential extension of the support, wherein said first band is substantially smaller than said second band.

2. Elastic support according to claim 1, wherein said body includes one or more conductive paths where said polymeric material supplemented with carbon-based nanofillers has been made locally electrically-conductive by laser irradiation, so as to define one or more electrical connection lines of said piezo-resistive areas with electrodes associated with said body.

3. Elastic support according to claim 2, wherein said support comprises a plurality of said piezo-resistive areas electrically connected in series with each other by said conductive paths.

4. A motor-vehicle suspension comprising at least one pair of supports according to claim 3.

5. A motor-vehicle suspension comprising at least one pair of supports according to claim 2.

6. A motor-vehicle comprising a plurality of supports according to claim 2, and an electronic control unit configured to monitor the electrical resistance of one or more electrically-conductive paths including said piezo-resistive areas and to actuate an on-board system of said motor-vehicle adapted to improve the comfort of the driver of the motor-vehicle and/or to improve the grip of the motor-vehicle in the case in which the measured electrical resistance deviates from a predetermined threshold value.

7. Elastic support according to claim 1, wherein said support is a pad of a shock absorber unit of a suspension of the motor-vehicle.

8. A motor-vehicle suspension comprising at least one pair of supports according to claim 7.

9. A motor-vehicle comprising a plurality of supports according to claim 7, and an electronic control unit configured to monitor the electrical resistance of one or more electrically-conductive paths including said piezo-resistive areas and to actuate an on-board system of said motor-vehicle adapted to improve the comfort of the driver of the motor-vehicle and/or to improve the grip of the motor-vehicle in the case in which the measured electrical resistance deviates from a predetermined threshold value.

10. Elastic support according to claim 1, wherein said support is an elastic bushing for articulating a pivoting arm of a suspension of the motor-vehicle.

11. A motor-vehicle suspension comprising at least one pair of supports according to claim 10.

12. A motor-vehicle comprising a plurality of supports according to claim 10, and an electronic control unit configured to monitor the electrical resistance of one or more electrically-conductive paths including said piezo-resistive areas and to actuate an on-board system of said motor-vehicle adapted to improve the comfort of the driver of the motor-vehicle and/or to improve the grip of the motor-vehicle in the case in which the measured electrical resistance deviates from a predetermined threshold value.

13. Elastic support according to claim 1, wherein said support is a plug of an engine suspension of the motor-vehicle.

14. A motor-vehicle suspension comprising at least one pair of supports according to claim 13.

15. A motor-vehicle comprising a plurality of supports according to claim 13, and an electronic control unit configured to monitor the electrical resistance of one or more electrically-conductive paths including said piezo-resistive areas and to actuate an on-board system of said motor-vehicle adapted to improve the comfort of the driver of the motor-vehicle and/or to improve the grip of the motor-vehicle in the case in which the measured electrical resistance deviates from a predetermined threshold value.

16. A motor-vehicle suspension comprising at least one pair of supports according to claim 1.

17. A motor-vehicle comprising a plurality of supports according to claim 1, and an electronic control unit configured to monitor the electrical resistance of one or more electrically-conductive paths including said piezo-resistive areas and to actuate an on-board system of said motor-vehicle adapted to improve the comfort of the driver of the motor-vehicle and/or to improve the grip of the motor-vehicle in the case in which the measured electrical resistance deviates from a predetermined threshold value.

18. A motor-vehicle comprising a plurality of supports according to claim 1, and an electronic control unit configured to monitor the electrical resistance of one or more electrically-conductive paths including said piezo-resistive areas and to actuate an on-board system of said motor-vehicle adapted to improve the comfort of the driver of the motor-vehicle and/or to improve the grip of the motor-vehicle in the case in which the measured electrical resistance deviates from a predetermined threshold value.

19. An elastic support for a suspension system of a motor-vehicle, comprising:
    at least one body formed of polymeric elastomeric material;
    the outer surface of said body having one or more piezo-resistive areas where a polymeric material supplemented with carbon-based nanofillers of said body has been made locally piezo-resistive by laser irradiation, so as to define one or more electric deformation sensors capable of detecting a load applied on said elastic support; and
    wherein said piezo-resistive areas are in the form of a first sensorized band and a second sensorized band, which both extend along the circumferential extension of the support, and wherein said first band is substantially smaller than said second band.

* * * * *